United States Patent [19]

Miki

[11] Patent Number: 5,099,122
[45] Date of Patent: Mar. 24, 1992

[54] METHOD FOR EVALUATION OF TRANSITION REGION OF SILICON EPITAXIAL WAFER

[75] Inventor: Katsuhiko Miki, Gunma, Japan

[73] Assignee: Shin-Etsu Handotai Co., Ltd., Tokyo, Japan

[21] Appl. No.: 441,304

[22] Filed: Nov. 27, 1989

[30] Foreign Application Priority Data

Nov. 25, 1988 [JP]   Japan ................................. 63-296321

[51] Int. Cl.$^5$ .............................................. G01B 11/02
[52] U.S. Cl. .................................... 250/341; 250/340
[58] Field of Search .................... 250/338.1, 340, 341; 356/357, 381

[56] References Cited

U.S. PATENT DOCUMENTS

| 4,203,799 | 5/1980 | Sugawara et al. | 356/357 X |
| 4,522,510 | 6/1985 | Rosencwaig et al. | 356/381 X |
| 4,555,767 | 11/1985 | Case et al. | 250/341 X |
| 4,625,114 | 11/1986 | Bosacchi et al. | 250/341 |

OTHER PUBLICATIONS

Schumann, Jr., "The Infrared Interference Method of Measuring Epitaxial Layer Thickness", J. Electrochem. Soc., vol. 116, No. 3, Mar. 1969, pp. 409–413.

Schumann, Jr. et al., "Measurement of Silicon Epitaxial Layers Less Than 1-y Thick by Infrared Interference", J. Applied Physics, vol. 41, No. 8, Jul. 1970, pp. 3532–3535.

Schumann, Jr. et al. "Phase Shift Corrections For Infrared Interference Measurement of Epitaxial Layer Thickness", J. Electrochem. Soc., vol. 113, No. 4, Apr. 1966, pp. 368–371.

Cox et al., "Measurement of Si Epitaxial Thickness Using a Michelson Interferometer", J. Electrochem. Soc., vol. 120, No. 2, Feb. 1973, pp. 287–292.

American Society for Testing Materials, F95-89 (1989).

Spitzer et al., "Interference Method for Measuring the Thickness of Epitaxially Grown Films," vol. 32, 1961, pp. 744–745.

Primary Examiner—Constantine Hannaher
Assistant Examiner—Edward J. Glick
Attorney, Agent, or Firm—Scully, Scott, Murphy & Presser

[57] ABSTRACT

A method is disclosed for evaluation of the transition region of a silicon epitaxial wafer comprising obtaining the waveform of an interferogram signal for reflected light by irradiation the silicon epitaxial wafer with infrared radiation followed by measurement of the intensity of the light of the interference fringe employing a Michelson interferometer and obtaining the extent of the transition region of the silicon epitaxial wafer by measuring the distance between the maximum peak of the waveform in the side burst region in the interferogram signal and the peak adjacent to said maximum peak of the waveform in the side burst region in the interferogram signal and the distance between the maximum peak and the bottom first coming after said maximum peak of the waveform in the side burst region in the interferogram signal, or the difference in height between the maximum peak and the bottom first coming after said maximum peak of the waveform in the side burst region in the interferogram signal.

3 Claims, 6 Drawing Sheets

○ X̄ OF L AND R

● ONLY L

X: 10 μm MAX
Y: 5 cm/v

X: 10 μm MAX
Y: 5 cm/v

METHOD FOR EVALUATION OF TRANSITION REGION OF SILICON EPITAXIAL WAFER

BACKGROUND OF THE INVENTION

This invention relates to a method of evaluating the profile of dopant concentration in the vicinity of the growth interface between a vapor phase growth layer and a substrate of silicon epitaxial wafer and particularly relates to a method for evaluation of the extent of the transition region in a silicon epitaxial wafer based on an interferogram of infrared radiation reflected from a free surface of a vapor phase growth layer and the growth interface between said vapor phase growth layer as well as the vicinity of the growth interface and the substrate in silicon epitaxial wafer. This is effected by measurement of the intensity of the interference fringes employing a Michelson interferometer in which infrared radiation is used as a light source for the measurement.

Epitaxial growth is one of the basic techniques in the industrial field of silicon semiconductor electronic device fabrication. This technique is employed not only in the manufacture of bipolar transistors and bipolar integrated circuits but also in the manufacture of MOS integrated circuits.

In the epitaxial growth technique, an epitaxial growth layer is formed on a silicon single crystal substrate doped with an active impurity, usually of high concentration, in a high temperature, depending on circumstances, in an atmosphere of gas which is apt to deposit silicon atoms through chemical reactions on the silicon single crystal. In the vicinity of the growth interface between this epitaxial growth layer and the silicon single crystal substrate, a part of an active impurity in said single crystal substrate is taken in said growth layer, whereby the region in which concentration of active impurity changes (hereinafter, referred to as "the transition region") is formed in the growth layer. This transition region consists of the thermal diffusion region which is generated by thermal diffusion of an active impurity contained in the single crystal substrate, and the auto doping region which is generated through the incorporation of the active impurity in a gaseous state during the course of chemical reaction and epitaxial growth, wherein generally both phenomena occur concurrently.

Recently, demand has been built up to form epitaxial growth layers which are considerably thinner because inter alia, to improve the high frequency characteristic of semiconductor electronic devices. At present, it is possible to form a vapor phase growth layer with a thickness under 0.5 μm.

There is, however, a spreading of the transition region in the vicinity of the growth interface between an epitaxial growth layer and a single crystal substrate and a change in dopant level with regard to thickness at the transition region which have effects upon the functions of a silicon semiconductor device. Such effects upon the functions of a silicon semiconductor device by the doping of transition region cannot be disregarded even when the thickness of epitaxial growth layer is thicker, for example 10 μm. Therefore, the above effects are problems which have to be solved in designing these silicon semiconductor devices.

Heretofore, the transition region in the vicinity of the growth interface between an epitaxial growth layer and a single crystal substrate is determined by various known methods, and trials are made at dimensional evaluation of the transition region. However, these methods of evaluation are complicated, and inefficient. Further, these conventional evaluation methods are destructive and practically insufficient.

The transition region can be determined, for example, by the spreading resistance method, which is conventional.

As shown in FIG. 1(a), a test piece used in the spreading resistance method is a chip 100 with the square surfaces of about 5 mm×5 mm, which is cut from a wafer having epitaxial growth layer e on a substrate b and which has a polished surface to be measured which is obliquely cut at an angle of 1-5 degrees to the surface. A set of osmium probes 101, 101 is moved by microscopic intervals in parallel with the upper edge in a slanting direction across the slanting surface to be measured; spreading resistances between osmium probes are then measured. From plotting the values of the measured spreading resistances with respect to the depth from the surface of epitaxial growth layer as shown FIG. 1(b), the transition region T can be obtained.

This method takes over 30 minutes time and besides is a destructive test.

Further, and conventionally, the transition region is determined by a C-V method. As shown in FIG. 2(a), in the C-V method, the capacity-voltage characteristic between a metallic electrode formed through oxide film on a surface of epitaxial wafer to be measured and an ohmic contact electrode formed on the rear of said epitaxial wafer is measured, and from these measured data, a profile of dopant concentration is obtained as a relationship of impurity concentration at a depth from the surface of the wafer as shown in FIG. 2(b). From this profile, the transition region can be obtained.

This method also takes time over 30 minutes, and again is a destructive test. Further, when the concentration of impurities is more than $5 \times 10^{18}$ atoms/cm$^3$, the spreading of the depletion layer does not occur regardless of any applied voltage so that measurement becomes impossible.

SUMMARY OF THE INVENTION

In order to solve the problems based on the defects of the conventional methods, the present invention has as its object, the provision of a method for evaluating, in a short time and in a nondestructive way, an active impurity contained in a single crystal substrate intermixed at high concentrations into an epitaxial growth layer in the vicinity of the growth interface between the epitaxial growth layer and a single crystal substrate of epitaxial wafer, by thermal diffusion of the active impurity into the epitaxial growth layer and/or auto-doping. This is done by measurement of the intensity of the interference fringe when employing a Michelson interferometer and thereby determining the extent of the transition region in thickness.

A more specific object of the invention is the evaluation of the transition region of a silicon epitaxial wafer having a vapor phase growth silicon single crystal layer formed on a silicon single crystal substrate which has a dopant concentration not less than $1 \times 10^{18}$ atoms/cm$^3$. This can be achieved according to the present invention, by irradiating the surface of a sample of a silicon epitaxial wafer with infrared radiation the wafer having a vapor phase growth silicon single crystal layer formed on a silicon single crystal substrate and a dopant concentration not less than $1 \times 10^{18}$ atoms/cm$^3$, followed by measuring the intensity of interference fringe corresponding to plural optical path differences for light rays reflected by the surface of said wafer and (1) the growth interface between the vapor phase growth silicon single crystal layer and the silicon single crystal substrate and (2) the vicinity of said growth interface. The method further comprises measurement of the intensity of the interference fringe employing a Michelson interferometer and infrared radiation as light for the measurement. The waveform of the interferogram signal is obtained, and the extent of the transition region in the epitaxial wafer is determined from the characteristics of the waveform in the side burst region of the interferogram signal.

A method for evaluation of the transition region of the silicon epitaxial wafer according to the invention is based on the confirmed concept that the extent of the transition region can be determined by obtaining an interferogram signal of a scanning type from interference fringes for light rays reflected by (1) the growth interface between the vapor phase growth silicon single crystal layer and the silicon single crystal substrate and (2) the vicinity of said growth interface. This is done by measuring the intensity of the interference fringe obtained when employing a Michelson interferometer or the electric signal corresponding to the interferogram signal from such interferometer and measuring the distance on the abscissa or displacement of the scanning mirror between the maximum peak in a side burst region on one side of the interferogram signal and the peak adjacent to said maximum peak. Another measurement made is the distance on the ordinate or difference of the intensity of the interferogram signal between the maximum peak in the side burst region and the bottom first coming after said maximum peak, and comparing these measurements with values, in terms of thickness, of the extent of the transition region determined by a conventional method and thereby obtaining a reading of the extent of the transition region from the comparison of the measurements obtained from the interferogram with values of the extent of the transition region obtained by the conventional method.

Further, an alternate method for evaluation of the transition region of silicon epitaxial wafer according to the present invention is based on the confirmed concept that the extent of the transition region can be determined by comparing values obtained from the difference in height (difference of amount of reflected light) between the maximum peak in the side burst region and the bottom first coming after said maximum peak with the measured value of the extent of the transition region obtained according to the above conventional method, and thereby reading the extent of the transition region from said measured value of the interferogram signal.

Accordingly, in a method for evaluation of the transition region of a silicon epitaxial wafer according to the present invention, an object of measurement is a side burst of the interferogram signal obtained by signal conversion of intensity of the interference fringe employing a Michelson interferometer in which infrared radiation is used as the light for measurement.

When the transition region in a silicon epitaxial wafer is evaluated according to the present invention, it is necessary that dopant level of the single crystal substrate is more than $1 \times 10^{18}$ atoms/cm$^3$ while the dopant level of the vapor phase growth layer is less than $1 \times 10^{17}$ atoms/cm$^3$ in order that infrared radiation reflected from the growth interface between the vapor phase growth layer and the substrate can be effectively transmitted through the vapor phase growth layer, and that infrared radiation can be reflected by the growth interface between the vapor phase growth layer and the substrate.

The interferogram signal of the scanning type from a silicon epitaxial wafer as used in the present invention is obtained according to measurement of the intensity of light of the interference fringe employing a Michelson interferometer in which infrared radiation is used and, which is obtained conventionally when the thickness of an epitaxial growth silicon single crystal layer of a silicon epitaxial wafer is measured from the intensity of the interference fringe.

In the measurement of the intensity of the interference fringe employing a Michelson interferometer in which infrared radiation is used as the light source for the measurement, the surface of silicon epitaxial wafer having a vapor phase growth silicon single crystal layer on a silicon single crystal substrate, is irradiated with infrared radiation and infrared radiation reflection from the surface, the growth interface between the vapor phase growth layer and the substrate and the vicinity of the growth interface. The reflected radiation is introduced to a beam splitter formed from a semi-transparent film. One part of one reflected light of the infrared radiation from among said reflected infrared radiations is reflected by the beam splitter while another part of said one reflected light is transmitted through the beam splitter. The reflected infrared radiation from said beam splitter is again reflected, for example, by a fixed plane mirror arranged at a fixed distance from the beam splitter.

The infrared radiation reflected by the fixed plane mirror is sent back to the beam splitter, and said reflected infrared radiation is transmitted through the beam splitter to be sent to the detector. On the other hand, another part of the one reflected light of infrared radiation which is transmitted through the beam splitter is again reflected by a scanning plane mirror which is movably arranged at a position in which an optical path difference is produced relative to the fixed plane mirror. The other part of the one light of infrared radiation reflected by the scanning plane mirror is sent back to the beam splitter and again reflected by the beam splitter to be sent to the detector wherein the intensity of the interference fringe depending on an optical path difference is measured. Further in the same way as the above, except that a position of the scanning plane mirror is changed from the first position thereof, the intensity of the interference fringe depending on different optical path differences is measured for both infrared radiation reflected by the beam splitter and infrared radiation transmitted through the beam splitter. These measurement processes are repeated so that the intensity of the interference fringe by each optical path difference for both infrared radiation reflected by the beam splitter and infrared radiation transmitted through the beam splitter is obtained to give a wave form of the interferogram signal on a chart.

In the measurement of the intensity of the interference fringe employing a Michelson interferometer, the amount of light received at the detector is maximized and the electric signal which is photoelectrically converted becomes peak, when a scanning plane mirror is positioned at a position such that a delay of the optical phase is zero and when a scanning plane mirror is position at a position spaced with the distance $L = 2ND \cos \Phi'$ on any side relative to the position so that a delay of optical phase is zero (wherein L is a position in the scanning direction of a scanning mirror, N is the refractive index of the epitaxial growth layer, D is a thickness of vapor phase growth layer, and $\Phi'$ is an angle of a progressing direction in the epitaxial growth layer of the incident ray relative to a normal of the surface of the epitaxial growth layer).

In the interferogram of the scanning type obtained in such a way, both a center burst at a center and two side bursts on both sides thereof usually appears as shown in FIG. 3.

The inventors analyzed waveforms of side bursts on the left or right side in the interferogram signal of the scanning type and compared the distance between the maximum peak in the side burst region and the peak adjacent to said maximum peak, and the distance between the maximum peak and the bottom first coming after said peak and the difference in height (difference of amount of reflected light) between the maximum peak and the bottom first coming after said maximum peak with the measured values of the transition region extents obtained in a conventional way, for example, in a spreading resistance measurement, and found that there is a fixed relation between them. Accordingly in the present invention, by utilizing this relation, determined it is an extent of the region in which the active impurity is distributed with a high concentration in the vicinity of the growth interface between the vapor growth layer and the substrate.

A region having about the same concentration of active impurity as that in the substrate is formed to about 2 μm thickness depending on conditions, the rest being the effective distance in the direction of the thickness in forming an electric device. The effective thickness of the epitaxial layer having a controlled active dopant level, decreases by the above transition region as compared with that of the actual growth interface between the vapor phase growth layer and the substrate. This transition region extent cannot be disregarded for designing a semiconductor electric device. Herein the word "transition region extent" means T.E. as shown in FIG. 4, which graphically shows a profile of dopant concentration change (measured by the spreading resistance method) in the epitaxial growth layer and the vicinity of the growth interface between the epitaxial growth layer and the substrate.

In FIG. 4, the left part of the curve shows dopant concentration with respect to depth of the vapor growth layer, wherein a and $a_0$ designate constant dopant levels. The right part shows dopant concentration with respect to depth of the substrate and $e_0$ designates the dopant level of the substrate. In FIG. 4, the middle part of $b_0$, $c_0$ and $d_0$ are the region in which the dopant concentration level drastically changes, wherein $c_0$ is almost a straight line in a semilog coordinate system with the ordinate in semilog scale. In the present invention, the transition region extent is defined with the fraction of thickness (T.E.) between one intersection $p_1$ of the extension of the above straight line $c_0$ and $a_1$ and $a_0$ level, and another intersection $p_2$ of the extension of the above straight line $c_0$ and $e_0$ level.

In the present invention; the distance between the maximum peak of a side burst and the peak adjacent to said peak of the side burst; the distance between the maximum peak of the side burst and the bottom first coming after said maximum peak; or difference in height between the maximum peak of the side burst and the bottom first coming after said maximum peak, have a fixed relationship with the extent of the transition region and have a strong correlation with the above interferogram measurements. The error of the calibration is less than 4% with repetition accuracy, when measurements are made by about 10 times for about 2 μm of the conventional transition region extent. Accordingly, this accuracy is sufficient for practical usage.

Thus, as mentioned above, and according to the present invention, the extent of the transition region of the epitaxial wafer, attributable to auto doping can be determined by analyzing the characteristics of the side burst region in the spectrum waveform obtained by measurement of intensity of the interference fringe employing a Michelson interferometer in which infrared radiation is used as the light for measurement. Therefore, measurements of the extent of the transition region of an epitaxial wafer can be made in a very short time without damaging the surface of a crystal semiconductor. This is difficult to obtain when conventional measuring methods are employed. Further as the extent of the transition region can be easily determined from an interferogram signal when the thickness of epitaxial wafer is determined, the method according to the invention is very convenient.

DETAILED DESCRIPTION OF THE INVENTION

The present invention will be further understood in view of the following example and reference to the drawings.

Figure 5:
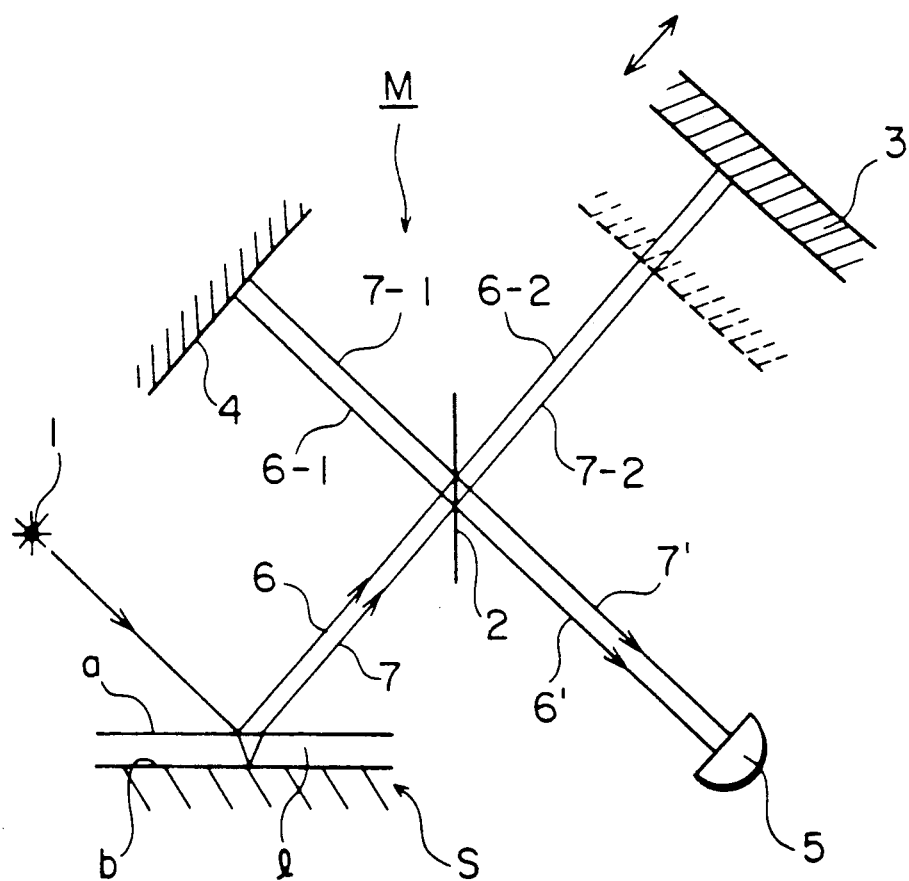
FIG. 5 is a schematic illustration of the structure of an apparatus for executing a method of measuring the intensity of an interference fringe employing a Michelson interferometer in which infrared radiation is used as a light for measurement.

FIG. 5 shows the fundamentals of an apparatus for measuring an interferogram of scanning type obtained in the Michelson interferometer for evaluating the distribution of active impurity in the vicinity of the growth interface between the epitaxial layer and the substrate in a silicon epitaxial wafer according to the invention.

The structure and the fundamentals of operation thereof are as follows:

In the present example, the Michelson interferometer, hitherto generally used as a measuring apparatus, is composed of a source of infrared radiation 1, a beamsplitter 2, a scanning plane mirror 3, a fixed plane mirror 4, a silicon epitaxial wafer S and a detector 5 and the like.

The silicon epitaxial wafer S is placed on a sample support and a surface a of the silicon epitaxial wafer S is irradiated with a beam of infrared radiation from the source of infrared radiation 1. As very lightly doped silicon is transparent in the infrared region, the incident infrared radiation is reflected by the growth interface b between the vapor phase growth layer and the substrate and the vicinity of said growth interface so that a reflected light of infrared radiation 7 is generated as well as the incident infrared radiation is reflected by a surface a of the epitaxial layer e in the silicon epitaxial wafer so that a reflected light of infrared radiation 6 is generated. One portion of these reflected beams of infrared radiation 6 and 7 are transmitted through the beam splitter 2 so that transmitted beams 6-2, 7-2 are generated and another portions of these reflected beams 6 and 7 of infrared radiation are reflected by the beam splitter 2 so that the reflected beams of infrared radiation 6-1, 7-1 are generated. In this example, the transmitted beams 6-2, and 7-2 are reflected by the scanning plane mirror 3, and then reflected by the back of the beam splitter 2. On the other hand, the reflected beams of infrared radiation 6-1 and 7-1 are reflected by the fixed plane mirror 4 and then transmitted through the beam splitter 2. The beam of infrared radiation 6-1 reflected by the beam splitter 2 is superimposed on the transmitted beam 6-2 which has been reflected by the scanning plane mirror 3 and then reflected by the back of the beam splitter 2 to form a beam of interference fringe 6'. The beam of interference fringe 6' is sent to the detector 5, in which intensity of the light of the interference fringe is measured for the reflected light of infrared radiation 6. On the other hand, the reflected beam of infrared radiation 7-1 is superimposed on the transmitted beam 7-2 which has been reflected by the scanning plane mirror 3 and then reflected by the back of the beam splitter 2 to form interference fringe 7'. Interference fringe 7' is sent to the detector 5 in which intensity of interference fringe is measured for the reflected light of the infrared radiation 7.

Then as the scanning plane mirror 3 is arranged so as to be able to move in the optical axial direction, a position of the scanning plane mirror 3 is moved in the optical axial direction, and then an intensity of the interference fringe is measured.

In the present example, the position of the scanning plane mirror 3 is precisely measured by the interferometer and the like whenever the scanning plane mirror 3 is moved in the optical axial direction.

Figure 1A:
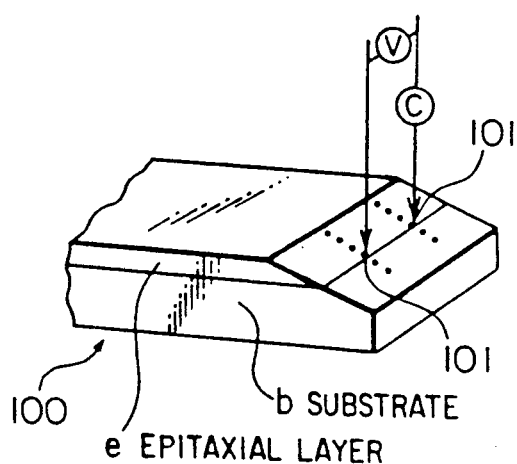
FIG. 1(a) is a perspective view showing the condition in which the spreading resistance method is executed.
Figure 1B:
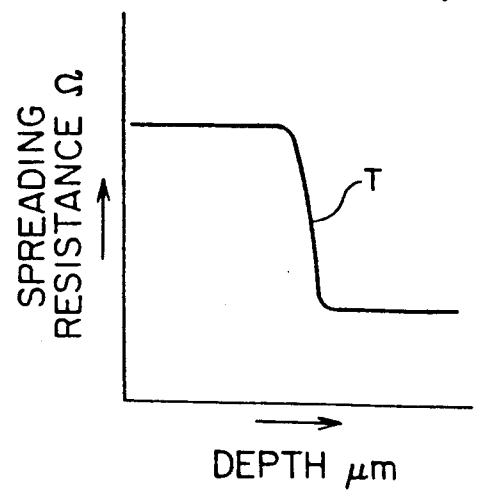
FIG. 1(b) is a graph showing measurements obtained in the spreading resistance method.
Figure 2A:
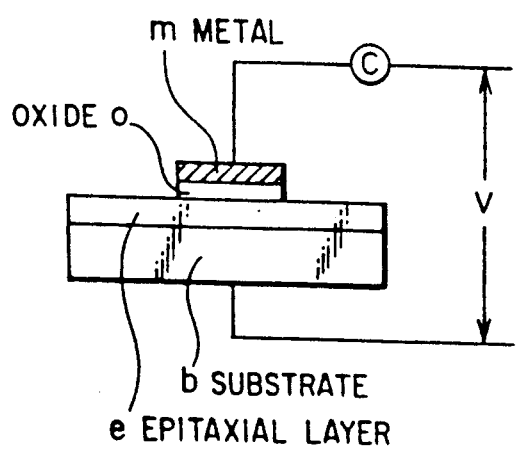
FIG. 2(a) is a diagram explaining the condition in which the C-V method is executed.
Figure 2B:
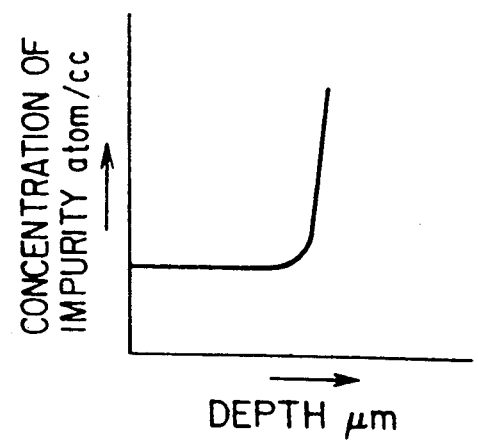
FIG. 2(b) is a graph showing measurements obtained in the C-V method.
Figure 3:
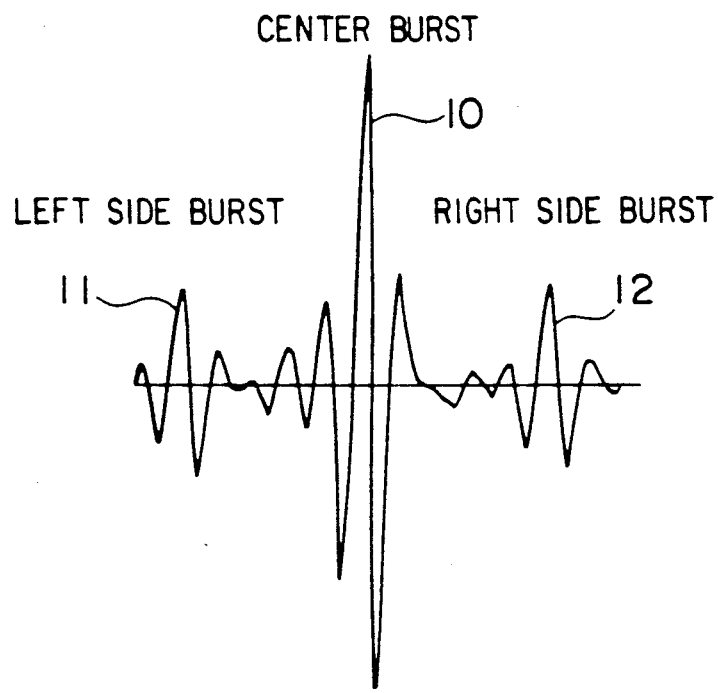
FIG. 3 is a spectrum waveform.
Figure 4:
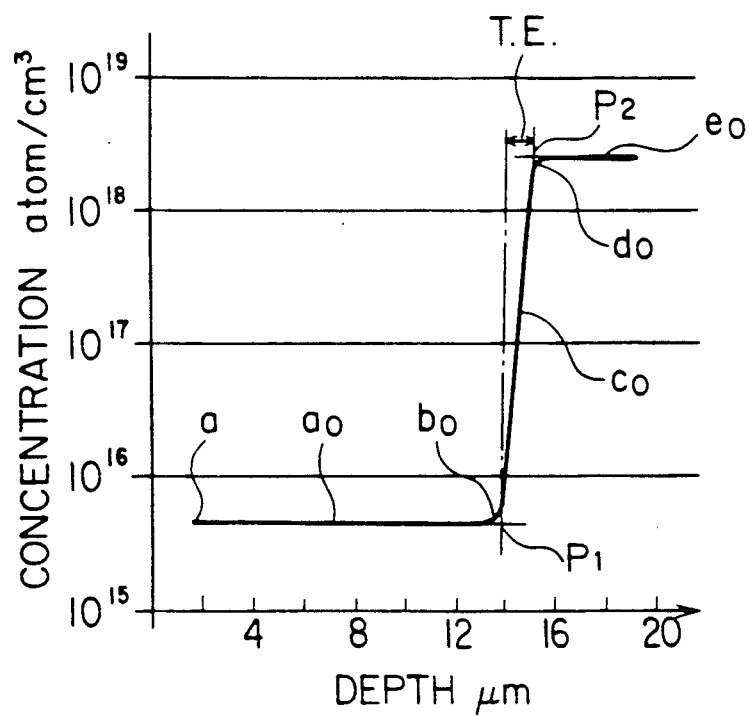
FIG. 4 is a semilog coordinate graph of concentrations measured in the spreading resistance method with respect to depth.

The result of the analysis of the waveform of the interferogram signal of the scanning type obtained from the above infrared radiation Michelson interferometer is set forth. It is then shown by example that there is a correlation (when comparing to a standard) of distances between the maximum peaks in side bursts, and peak region adjacent to said maximum peak in the side burst region, or distances between the maximum peaks and bottoms first coming after side bursts and the transition region, the extent (T.E.) of the growth interface between the epitaxial growth layer and the substrate. This is illustrated in FIG. 4. Further, there is a correlation between the same transition region extent (T.E.) and a difference in height (differences of amounts of light) between the maximum peaks and bottoms first coming after the maximum peaks in the interferogram signal. The spreading resistance method is employed for measuring the standard transition region extents.

Figure 6:
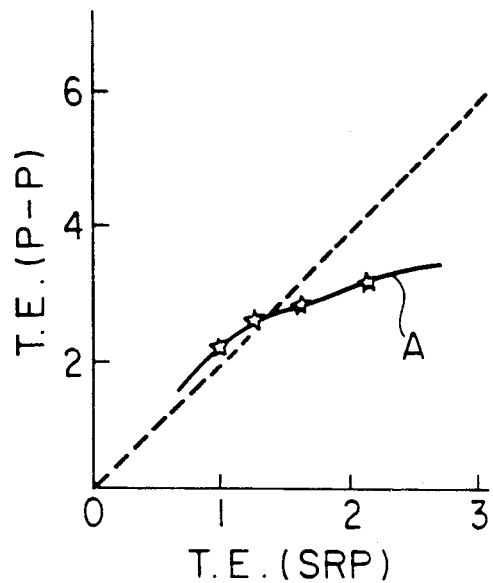
FIG. 6 is a diagram of correlation between distances between maximum peaks in a side burst region and peaks adjacent to said maximum peaks in the side burst region and the transition region extents measured in the spreading resistance method.
Figure 7:
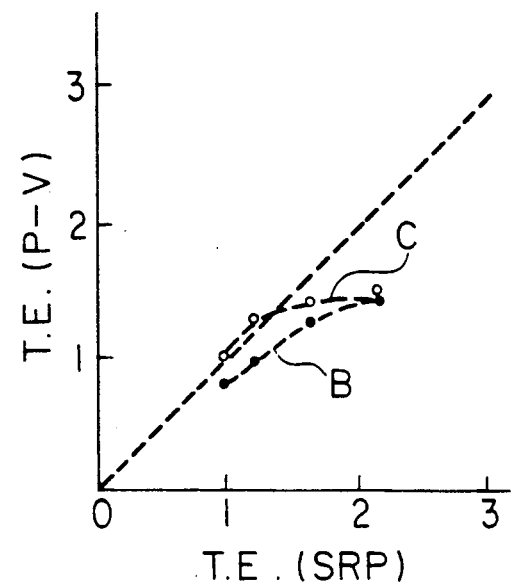
FIG. 7 is a diagram of correlation between distances between the maximum peaks and bottoms first coming after said maximum peaks in a side burst region and the transition region extents measured in the spreading resistance method.

FIGS. 6 and 7 are graphs respectively showing the relation between T.E. values measured by the spreading resistance method to evaluate samples of silicon epitaxial wafers having different transition region extents and distances (P—P) between the maximum peaks in the side burst region of measured interferogram signals and peaks adjacent to said maximum peaks in the side burst region; and distances (P-V) between the maximum peaks and bottoms first coming after said maximum peaks in side burst regions of the measured interferograms.

FIG. 7 shows a curve for T.E. (P-V) with respect to T.E. (SRP) measured about the average value of left side bursts and right side bursts in measured interferogram waveforms (C) and a curve for T.E. (P-V) with respect to T.E. (SRP) measured only about the left side bursts.

Figure 8:
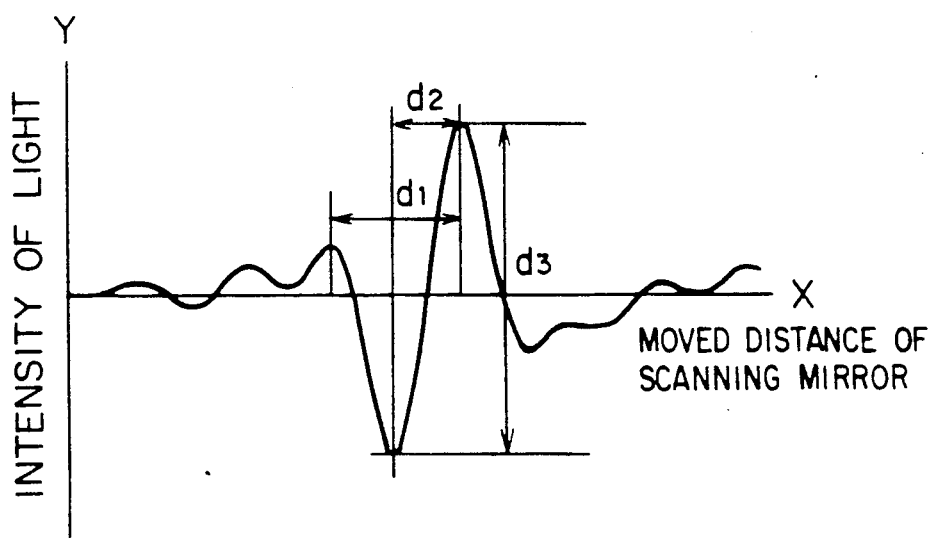
FIG. 8 is an enlarged view of the side burst wave form.

As shown in FIG. 8, peaks and bottoms in the side burst region which are measured objectives, are always selected so as to include the maximum peak. Accordingly, in FIG. 8, a distance between a peak and a peak in the side burst region is a distance ($d_1$) between the maximum peak and the peak adjacent to the maximum peak, and a distance between a peak and a bottom is a distance ($d_2$) between the maximum peak and the bottom first coming after the maximum peak.

FIG. 6 is a correlation of distances between the maximum peaks and peaks adjacent to said maximum peaks in the side burst region, and the transition region extent is obtained by the spreading resistance method.

Examinations of four different samples were made. In FIG. 6, four points designate the averages of measurements from respective samples. When these measurement points are approximately connected with a curve, curve A, which is a calibration curve for measuring, the transition region extent (T.E.) of a silicon epitaxial wafer, is obtained.

When T.E. is small, for example, in the neighborhood of 1 $\mu$m, a gradient of the curve is great and the accuracy of measurement is high. When T.E. is the neighborhood of 2 $\mu$m, a gradient of the curve becomes small. The control of T.E. under about 2 $\mu$m is possible in the present epitaxial growth technique.

FIG. 7 is a curve of T.E. (P-V) with respect to T.E. (SRP) for distances between peaks and bottoms of the side bursts, which shows the same tendency as in FIG. 7. Curve B is a calibration curve for the transition region extent (T.E.).

Figure 9:
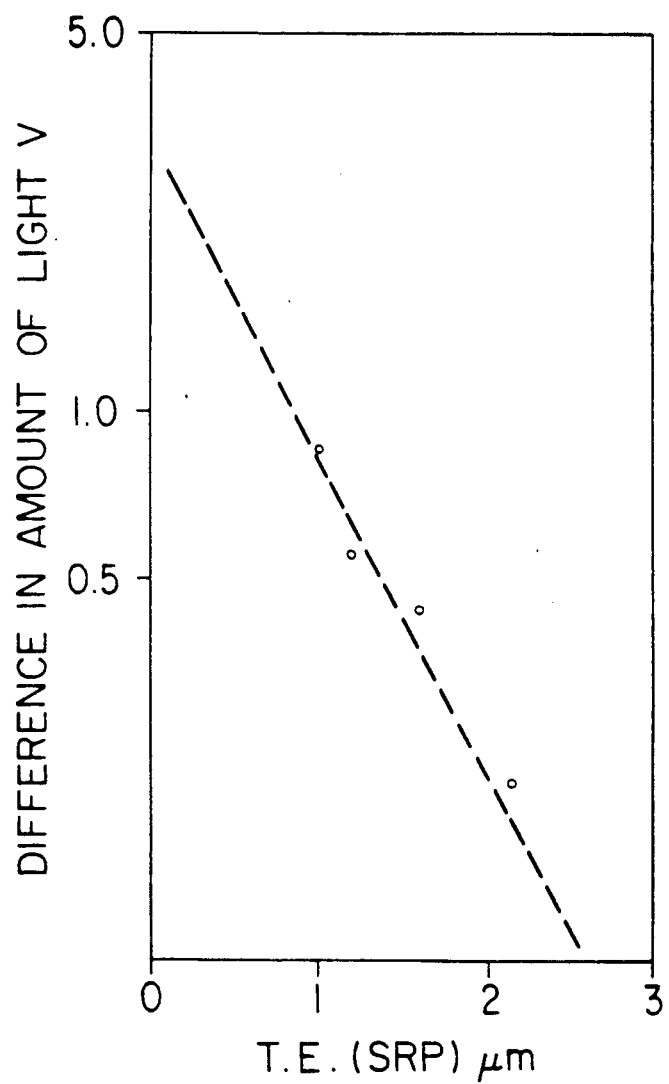
FIG. 9 is a diagram of the correlation between differences in height between the maximum peaks and bottoms first coming after said maximum peaks of a side burst and the transition region extent measured in the spreading resistance method.

FIG. 9 is a correlation between differences in height (differences in amounts of light) of the maximum peaks and bottoms first coming after said maximum peaks in the side burst region, that is $d_3$ shown in FIG. 8 and the measured value of the transition region extent (T.E.) measured by the spreading resistance method.

Examinations of four kinds of samples were made. The relation between differences in the amount of light (V) and the transition region extent (T.E.) can be expressed as follows;

$$V = K_1 e^{-K_2(T.E.)}$$

wherein $K_1 = 2.94$, $K_2 = 1.30$.

EXAMPLE OF MEASUREMENTS OF EPITAXIAL WAFER

Examples of measurements of epitaxial wafer of $P_{on}P^+$ grown in an epitaxial furnace of cylinder type are shown as follows.

Reaction conditions: A furnace of cylinder type;
Reaction temperature: two cases of 1130° C., 1150° C.;
Si material: SiHCl$_3$ (trichlorosilane);
thickness of epitaxial layer: 5.0 μm;
resistivity of epitaxial layer: 10 Ωcm (boron concentration $1.3 \times 10^{15}$ atoms/cm$^3$);
resistivity of substrate: 0.015 Ωcm (boron; concentration: $7 \times 10^{18}$ atoms/cm$^3$);
measured spectrum: shown in FIGS. 10 and 11.

Figure 10:
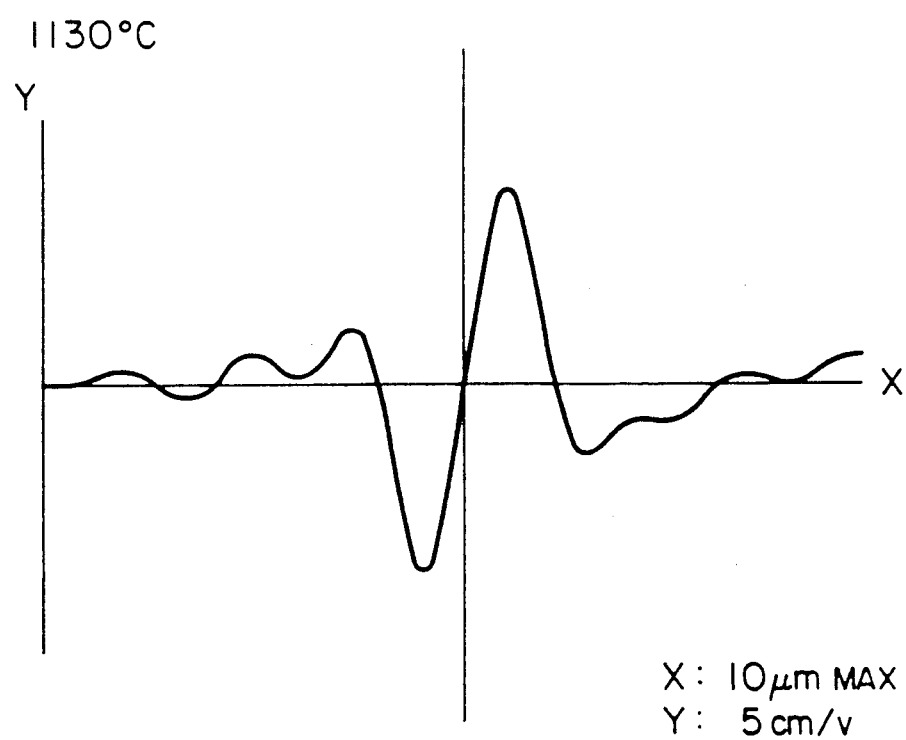
FIG. 10 is a diagram of an example of measurement of an epitaxial wafer formed on a substrate at 1130° C.
Figure 11:
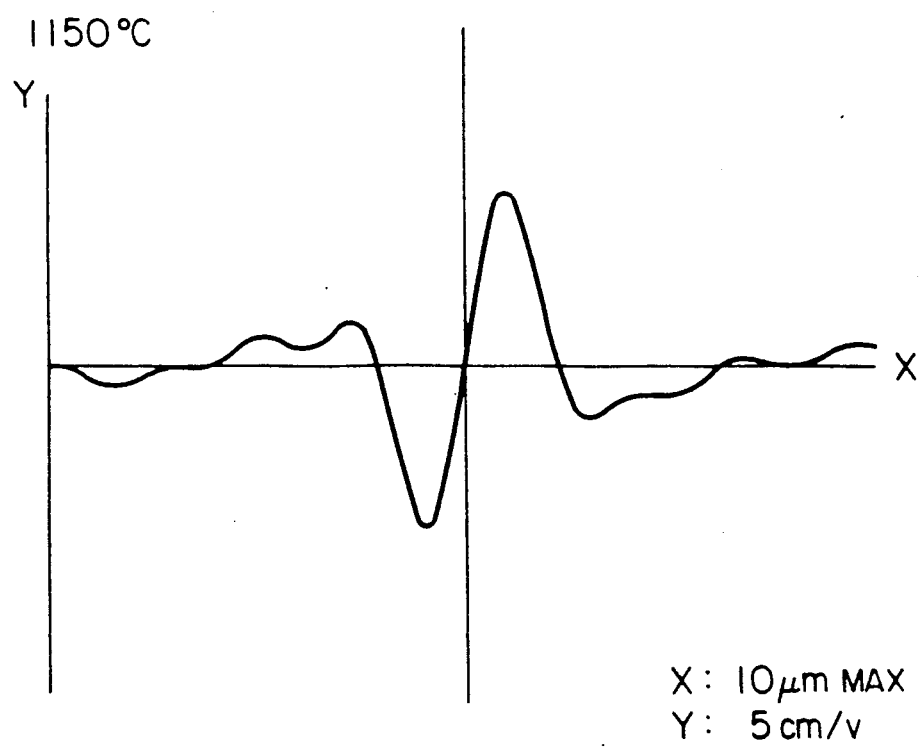
FIG. 11 is a diagram of an example of measurement of an epitaxial wafer formed on a substrate at 1150° C.

In FIG. 10 and FIG. 11, x shows the moved distance of the scanning mirror in 10 μm of the maximum distance. Y shows the intensity of light at a rate of 5 cm per volt.

Results of measurement:

In the case of the reaction temperature of 1130° C., $d_2$ (a distance between the maximum peak and the bottom first coming after said maximum peak in side burst region as shown in FIG. 8) = 0.96 μm; $d_3$ (a difference in height between the maximum peak and the bottom first coming after said maximum peak in side burst region as shown in FIG. 8) = 1.14 V;

accordingly, from FIG. 9, T.E. (SRP) = 0.075 μm.

In the case of the reaction temperature of 1150° C.:
$d_2 = 1.00$ μm;
$d_3 = 0.97$ V;
accordingly, from FIG. 9, T.E. (SRP) = 0.87 μm.

What is claimed is:

1. A method for the evaluation of the extent of the transition region of a silicon epitaxial wafer having a vapor phase growth single crystal layer on a substrate of a silicon single crystal having a dopant concentration not less than $1 \times 10^{18}$ atoms/cm$^3$, comprising: irradiating with infrared radiation a surface of a sample of a silicon epitaxial wafer in which a vapor phase growth single crystal layer is formed on a substrate of a silicon single crystal having a dopant concentration not less than $1 \times 10^{18}$ atoms/cm$^3$, obtaining a waveform of interferogram signals by measuring the intensity of the interference fringe which corresponds to plural optical path differences for light rays reflected from the surface of said sample and the growth interface between the vapor phase growth silicon single crystal layer and a substrate and the vicinity of the growth interface by measurement of the intensity of light of the interference fringe employing a Michelson interferometer; and obtaining the extent of said transition region of the epitaxial wafer from characteristics of a waveform between the maximum peak and a peak adjacent thereto in the side burst region in the interferogram signal.

2. A method for the evaluation of the extent of the transition region of a silicon epitaxial wafer as claimed in claim 1, wherein said characteristics of the waveform in a side burst region in the interferogram is the distance between the maximum peak and the peak adjacent to said maximum peak of the waveform or a distance between the maximum peak and the bottom first coming after said maximum peak of the waveform.

3. A method for the evaluation of the transition region of a silicon epitaxial wafer as claimed in claim 1, wherein said characteristics of the waveform of a side burst in the interferogram is the difference in height between the maximum peak and the bottom first coming after said maximum peak of the waveform.

* * * * *

UNITED STATES PATENT AND TRADEMARK OFFICE
CERTIFICATE OF CORRECTION

PATENT NO. : 5,099,122
DATED : March 24, 1992
INVENTOR(S) : Katsuhiko Miki It is certified that error appears in the above-identified patent and that said Letters Patent is hereby corrected as shown below:

Column 10, line 1: "0.075" should read as --0.75--

Signed and Sealed this

Nineteenth Day of October, 1993

Attest:

BRUCE LEHMAN

*Attesting Officer*        Commissioner of Patents and Trademarks